United States Patent
Mears et al.

(10) Patent No.: US 9,972,685 B2
(45) Date of Patent: May 15, 2018

(54) VERTICAL SEMICONDUCTOR DEVICES INCLUDING SUPERLATTICE PUNCH THROUGH STOP LAYER AND RELATED METHODS

(71) Applicant: ATOMERA INCORPORATED, Los Gatos, CA (US)

(72) Inventors: Robert Mears, Wellesley, MA (US); Hideki Takeuchi, Austin, TX (US); Erwin Trautmann, San Jose, CA (US)

(73) Assignee: ATOMERA INCORPORATED, Los Gatos, CA (US)

( * ) Notice: Subject to any disclaimer, the term of this patent is extended or adjusted under 35 U.S.C. 154(b) by 0 days. days.

(21) Appl. No.: 14/958,447

(22) Filed: Dec. 3, 2015

(65) Prior Publication Data
US 2016/0099317 A1    Apr. 7, 2016

Related U.S. Application Data

(62) Division of application No. 14/550,244, filed on Nov. 21, 2014, now Pat. No. 9,275,996.
(Continued)

(51) Int. Cl.
*H01L 29/165* (2006.01)
*H01L 29/15* (2006.01)
(Continued)

(52) U.S. Cl.
CPC .......... *H01L 29/152* (2013.01); *H01L 21/324* (2013.01); *H01L 21/823412* (2013.01);
(Continued)

(58) Field of Classification Search
CPC .......................... H01L 29/152; H01L 27/0886
See application file for complete search history.

(56) References Cited

U.S. PATENT DOCUMENTS

| | | |
|---|---|---|
| 4,485,128 A | 11/1984 | Dalal et al. |
| 4,590,399 A | 5/1986 | Roxlo et al. |

(Continued)

FOREIGN PATENT DOCUMENTS

| | | |
|---|---|---|
| EP | 0843361 | 5/1998 |
| GB | 2347520 | 6/2000 |

(Continued)

OTHER PUBLICATIONS

Tsu "Phenomena in silicon nanostructure devices" published online Sep. 6, 2000 by Applied Physics and Materials Science & Processing, pp. 391-402. See Priority U.S. Appl. No. 14/550,244, filed Nov. 21, 2014.
(Continued)

*Primary Examiner* — Kimberly Rizkallah
*Assistant Examiner* — Maria Ligai
(74) *Attorney, Agent, or Firm* — Allen, Dyer, Doppelt + Gilchrist, P.A.

(57) ABSTRACT

A semiconductor device may include a substrate, and a plurality of fins spaced apart on the substrate. Each of the fins may include a lower semiconductor fin portion extending vertically upward from the substrate, and at least one superlattice punch-through layer on the lower fin portion. The superlattice punch-through layer may include a plurality of stacked groups of layers, with each group of layers of the superlattice punch-through layer comprising a plurality of stacked base semiconductor monolayers defining a base semiconductor portion and at least one non-semiconductor monolayer constrained within a crystal lattice of adjacent base semiconductor portions. Each fin may also include an upper semiconductor fin portion on the at least one superlattice punch-through layer and extending vertically upward therefrom. The semiconductor device may also include
(Continued)

source and drain regions at opposing ends of the fins, and a gate overlying the fins.

12 Claims, 9 Drawing Sheets

Related U.S. Application Data

(60) Provisional application No. 61/907,598, filed on Nov. 22, 2013.

(51) Int. Cl.
    *H01L 29/66*     (2006.01)
    *H01L 29/78*     (2006.01)
    *H01L 29/10*     (2006.01)
    *H01L 21/324*     (2006.01)
    *H01L 21/8234*     (2006.01)
    *H01L 27/088*     (2006.01)
    *H01L 29/06*     (2006.01)

(52) U.S. Cl.
    CPC .. *H01L 21/823431* (2013.01); *H01L 27/0886* (2013.01); *H01L 29/0638* (2013.01); *H01L 29/1054* (2013.01); *H01L 29/1083* (2013.01); *H01L 29/155* (2013.01); *H01L 29/165* (2013.01); *H01L 29/66537* (2013.01); *H01L 29/66795* (2013.01); *H01L 29/785* (2013.01); *H01L 29/7851* (2013.01)

(56) References Cited

U.S. PATENT DOCUMENTS

| | | | |
|---|---|---|---|
| 4,594,603 A | 6/1986 | Holonyak, Jr. |
| 4,882,609 A | 11/1989 | Schubert et al. |
| 4,908,678 A | 3/1990 | Yamazaki |
| 4,937,204 A | 6/1990 | Ishibashi et al. |
| 4,969,031 A | 11/1990 | Kobayashi et al. |
| 5,055,887 A | 10/1991 | Yamazaki |
| 5,081,513 A | 1/1992 | Jackson et al. |
| 5,216,262 A | 6/1993 | Tsu |
| 5,357,119 A | 10/1994 | Wang et al. |
| 5,577,061 A | 11/1996 | Hasenberg et al. |
| 5,594,567 A | 1/1997 | Akiyama et al. |
| 5,606,177 A | 2/1997 | Wallace et al. |
| 5,616,515 A | 4/1997 | Okuno |
| 5,627,386 A | 5/1997 | Harvey et al. |
| 5,683,934 A | 11/1997 | Candelaria |
| 5,684,817 A | 11/1997 | Houdre et al. |
| 5,994,164 A | 11/1999 | Fonash et al. |
| 6,058,127 A | 5/2000 | Joannopoulos et al. |
| 6,255,150 B1 | 7/2001 | Wilk et al. |
| 6,274,007 B1 | 8/2001 | Smirnov et al. |
| 6,281,518 B1 | 8/2001 | Sato |
| 6,281,532 B1 | 8/2001 | Doyle et al. |
| 6,326,311 B1 | 12/2001 | Euda et al. |
| 6,344,271 B1 | 2/2002 | Yadav et al. |
| 6,350,993 B1 | 2/2002 | Chu et al. |
| 6,376,337 B1 | 4/2002 | Wang et al. |
| 6,436,784 B1 | 8/2002 | Allam |
| 6,472,685 B2 | 10/2002 | Takagi |
| 6,498,359 B2 | 12/2002 | Schmidt et al. |
| 6,501,092 B1 | 12/2002 | Nikonov et al. |
| 6,521,519 B2 | 2/2003 | Kamath et al. |
| 6,521,549 B1 | 2/2003 | Kamath et al. |
| 6,566,679 B2 | 5/2003 | Nikonov et al. |
| 6,608,327 B1 | 8/2003 | Davis et al. |
| 6,621,097 B2 | 9/2003 | Nikonov et al. |
| 6,638,838 B1 | 10/2003 | Eisenbeiser et al. |
| 6,646,293 B2 | 11/2003 | Emrick et al. |
| 6,673,646 B2 | 1/2004 | Droopad |
| 6,690,699 B2 | 2/2004 | Capasso et al. |
| 6,711,191 B1 | 3/2004 | Kozaki et al. |
| 6,741,624 B2 | 5/2004 | Mears et al. |
| 6,748,002 B2 | 6/2004 | Shveykin |
| 6,816,530 B2 | 11/2004 | Capasso et al. |
| 6,830,964 B1 | 12/2004 | Mears et al. |
| 6,833,294 B1 | 12/2004 | Mears et al. |
| 6,860,964 B2 | 3/2005 | Park |
| 6,878,576 B1 | 4/2005 | Mears et al. |
| 6,891,188 B2 | 5/2005 | Mears et al. |
| 6,897,472 B2 | 5/2005 | Mears et al. |
| 6,927,413 B2 | 8/2005 | Mears et al. |
| 6,952,018 B2 | 10/2005 | Mears et al. |
| 6,958,486 B2 | 10/2005 | Mears et al. |
| 6,993,222 B2 | 1/2006 | Mears et al. |
| 7,018,900 B2 | 3/2006 | Krepps |
| 7,033,437 B2 | 4/2006 | Mears et al. |
| 7,034,329 B2 | 4/2006 | Mears et al. |
| 7,045,377 B2 | 5/2006 | Mears et al. |
| 7,045,813 B2 | 5/2006 | Mears et al. |
| 7,071,119 B2 | 7/2006 | Mears et al. |
| 7,109,052 B2 | 9/2006 | Mears et al. |
| 7,123,792 B1 | 10/2006 | Mears et al. |
| 7,153,763 B2 | 12/2006 | Hytha et al. |
| 7,202,494 B2 | 4/2007 | Blanchard et al. |
| 7,227,174 B2 | 6/2007 | Mears et al. |
| 7,229,902 B2 | 6/2007 | Mears et al. |
| 7,265,002 B2 | 9/2007 | Mears et al. |
| 7,279,699 B2 | 10/2007 | Mears et al. |
| 7,279,701 B2 | 10/2007 | Kreps |
| 7,288,457 B2 | 10/2007 | Kreps |
| 7,303,948 B2 | 12/2007 | Mears et al. |
| 7,432,524 B2 | 10/2008 | Mears et al. |
| 7,435,988 B2 | 10/2008 | Mears et al. |
| 7,436,026 B2 | 10/2008 | Kreps |
| 7,446,002 B2 | 11/2008 | Mears et al. |
| 7,446,334 B2 | 11/2008 | Mears et al. |
| 7,491,587 B2 | 2/2009 | Rao |
| 7,514,328 B2 | 4/2009 | Rao |
| 7,517,702 B2 | 4/2009 | Halilov et al. |
| 7,531,828 B2 | 5/2009 | Mears et al. |
| 7,531,829 B2 | 5/2009 | Blanchard |
| 7,531,850 B2 | 5/2009 | Blanchard |
| 7,535,041 B2 | 5/2009 | Blanchard |
| 7,586,116 B2 | 9/2009 | Kreps et al. |
| 7,586,165 B2 | 9/2009 | Blanchard |
| 7,598,515 B2 | 10/2009 | Mears et al. |
| 7,612,366 B2 | 11/2009 | Mears et al. |
| 7,625,767 B2 | 12/2009 | Huang et al. |
| 7,659,539 B2 | 2/2010 | Kreps et al. |
| 7,700,447 B2 | 4/2010 | Dukovski et al. |
| 7,718,996 B2 | 5/2010 | Dukovski et al. |
| 7,781,827 B2 | 8/2010 | Rao |
| 7,812,339 B2 | 10/2010 | Mears et al. |
| 7,863,066 B2 | 1/2011 | Mears et al. |
| 7,880,161 B2 | 2/2011 | Mears et al. |
| 7,928,425 B2 | 4/2011 | Rao |
| 8,389,974 B2 | 3/2013 | Mears et al. |
| 8,497,171 B1 | 7/2013 | Wu et al. |
| 8,994,002 B2 * | 3/2015 | Lee .................. H01L 29/785 257/19 |
| 2002/0094003 A1 | 7/2002 | Bour et al. |
| 2003/0034529 A1 | 2/2003 | Fitzgerald et al. |
| 2003/0057416 A1 | 3/2003 | Currie et al. |
| 2003/0089899 A1 | 5/2003 | Lieber et al. |
| 2003/0162335 A1 | 8/2003 | Yuki et al. |
| 2003/0215990 A1 | 11/2003 | Fitzgerald et al. |
| 2004/0084781 A1 | 5/2004 | Ahn et al. |
| 2004/0227165 A1 | 11/2004 | Wang et al. |
| 2004/0262594 A1 | 12/2004 | Mears et al. |
| 2004/0262597 A1 | 12/2004 | Mears et al. |
| 2004/0266045 A1 | 12/2004 | Mears et al. |
| 2004/0266046 A1 | 12/2004 | Mears et al. |
| 2004/0266116 A1 | 12/2004 | Mears et al. |
| 2005/0029510 A1 | 2/2005 | Mears et al. |
| 2005/0032247 A1 | 2/2005 | Mears et al. |
| 2005/0163692 A1 | 7/2005 | Atanackovic |
| 2005/0208715 A1 | 9/2005 | Seo et al. |
| 2005/0279991 A1 | 12/2005 | Mears et al. |
| 2005/0282330 A1 | 12/2005 | Mears et al. |
| 2006/0011905 A1 | 1/2006 | Mears et al. |

(56) References Cited

U.S. PATENT DOCUMENTS

| | | | |
|---|---|---|---|
| 2006/0220118 A1 | 10/2006 | Stephenson et al. | |
| 2006/0223215 A1 | 10/2006 | Blanchard | |
| 2006/0226502 A1 | 10/2006 | Blanchard | |
| 2006/0231857 A1 | 10/2006 | Blanchard | |
| 2006/0243964 A1 | 11/2006 | Kreps et al. | |
| 2006/0263980 A1 | 11/2006 | Kreps et al. | |
| 2006/0267130 A1 | 11/2006 | Rao | |
| 2006/0273299 A1 | 12/2006 | Stephenson et al. | |
| 2006/0289049 A1 | 12/2006 | Rao | |
| 2006/0292765 A1 | 12/2006 | Blanchard et al. | |
| 2007/0010040 A1 | 1/2007 | Mears et al. | |
| 2007/0012910 A1 | 1/2007 | Mears et al. | |
| 2007/0015344 A1 | 1/2007 | Mears et al. | |
| 2007/0020833 A1 | 1/2007 | Mears et al. | |
| 2007/0020860 A1 | 1/2007 | Mears et al. | |
| 2007/0063185 A1* | 3/2007 | Rao | H01L 29/1054 257/18 |
| 2007/0063186 A1 | 3/2007 | Rao | |
| 2007/0158640 A1 | 7/2007 | Halilov et al. | |
| 2007/0166928 A1 | 7/2007 | Halilov et al. | |
| 2007/0187667 A1 | 8/2007 | Halilov et al. | |
| 2008/0012004 A1 | 1/2008 | Huang et al. | |
| 2009/0072276 A1 | 3/2009 | Inaba | |
| 2009/0267155 A1 | 10/2009 | Izumida et al. | |
| 2010/0270535 A1 | 10/2010 | Halilov et al. | |
| 2011/0215299 A1 | 9/2011 | Rao | |
| 2012/0261716 A1 | 10/2012 | Yanagihara | |
| 2013/0240836 A1 | 9/2013 | Lee et al. | |
| 2015/0144877 A1 | 5/2015 | Mears et al. | |
| 2015/0144878 A1 | 5/2015 | Mears et al. | |

FOREIGN PATENT DOCUMENTS

| | | |
|---|---|---|
| JP | 61027681 | 2/1986 |
| JP | 61145820 | 7/1986 |
| JP | 61220339 | 9/1986 |
| JP | 62219665 | 9/1987 |
| WO | 96/29728 | 9/1996 |
| WO | 99/63580 | 12/1999 |
| WO | 02/103767 | 12/2002 |
| WO | 2005034245 | 4/2005 |
| WO | 2005034325 | 4/2005 |

OTHER PUBLICATIONS

Luo et al., "Chemical Design of Direct-Gap Light-Emitting Silicon", published in Physical Review Letters, vol. 89, No. 7, Aug. 2002, 4 pgs. See Priority U.S. Appl. No. 14/550,244, filed Nov. 21, 2014.

Raphael Tsu "Si Based Green ELD: Si-Oxygen Superlattice" wysiwyg://1/http://www3.interscience.wiley.com/cgi-bin/abstract/72512946/start: published online Jul. 21, 2000; 2 pgs. Abstract Only. See Priority U.S. Appl. No. 14/550,244, filed Nov. 21, 2014.

Ye et al., GaAs MOSFET with Oxide Gate Dielectric Grown by Atomic Layer Deposition, Agere Systems, Mar. 2003; 7 pgs. See Priority U.S. Appl. No. 14/550,244, filed Nov. 21, 2014.

Novikov et al., Silicon-based Optoelectronics, 1999-2003, pp. 1-6 See Priority U.S. Appl. No. 14/550,244, filed Nov. 21, 2014.

Fan et al., N- and P-Type SiGe/Si Superlattice Coolers, the Seventeenth Intersociety Conference on Thermomechanical Phenomena in Electronic Systems (ITherm 2000), vol. 1, pp. 304-307, Las Vegas, NV, May 2000; 4 pgs. See Priority U.S. Appl. No. 14/550,244, filed Nov. 21, 2014.

Shah et al, Experimental Analysis and Theoretical Model for Anomalously High Ideality Factors (n>2.0) in AlGaN/GaN P-N Junction Diodes, Journal of Applied Physics, vol. 94, No. 4, Aug. 15, 2003; 4 pgs. See Priority U.S. Appl. No. 14/550,244, filed Nov. 21, 2014.

Ball, Striped Nanowires Shrink Electronics, news@nature.com, Feb. 7, 2002; 2 pgs. See Priority U.S. Appl. No. 14/550,244, filed Nov. 21, 2014.

Fiory et al., Light Emission from Silicon: Some Perspectives and Applications, Journal of Electronic Materials, vol. 32, No. 10, 2003; pp. 1043-1051. See Priority U.S. Appl. No. 14/550,244, filed Nov. 21, 2014.

Lecture 6: Light Emitting and Detecting Devices, MSE 6001, Semiconductor Materials Lectures, Fall 2004; 4 pgs. See Priority U.S. Appl. No. 14/550,244, filed Nov. 21, 2014.

Harvard University Professor and Nanosys Co-Founder, Charlie Lieber, Raises the Stakes in the Development of Nanoscale Superlattice Structures and Nanodevices, Feb. 8, 2002, Nanosys, Inc.; 2 pgs. See Priority U.S. Appl. No. 14/550,244, filed Nov. 21, 2014.

Bu, "FINFET Technology, a substrate prospective", IBM Research, PreT0 Alliance, SOI Conference, 2011, pp. 1-28. See Priority U.S. Appl. No. 14/550,244, filed Nov. 21, 2014.

Xu et al., "MOSFET performance and scalability enhancement by insertion of oxygen layers", Department of Electrical Engineering and Computer Science, University of California, Berkeley, 2012, pp. 1-4. See Priority U.S. Appl. No. 14/550,244, filed Nov. 21, 2014.

* cited by examiner

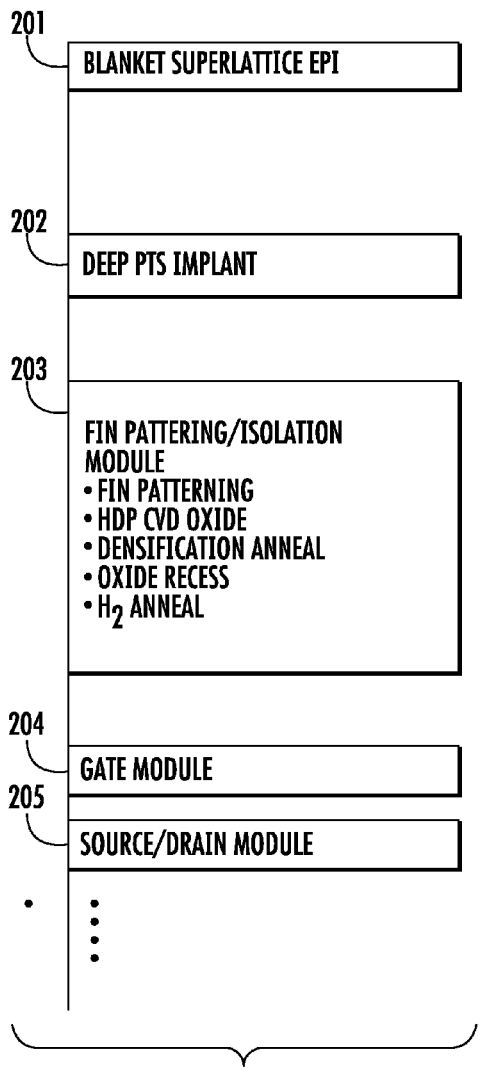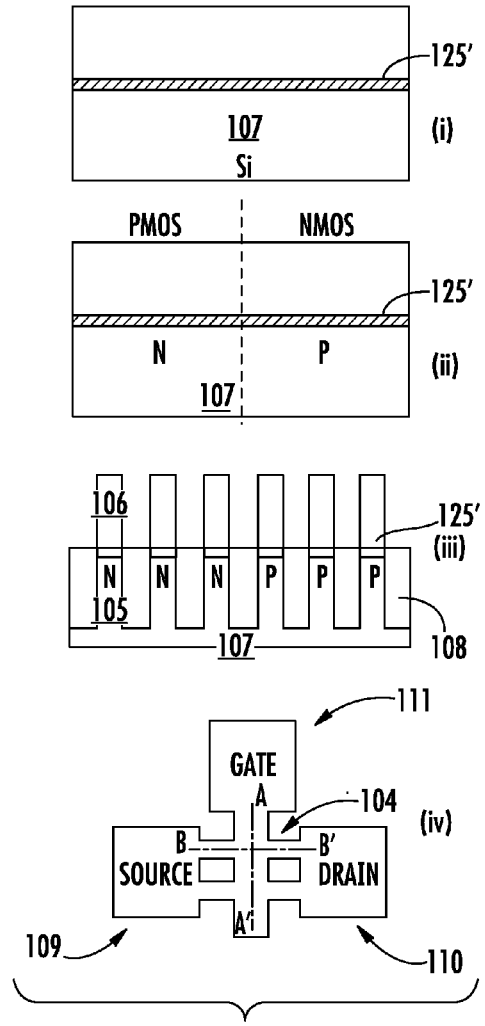
FIG. 9A
FIG. 9B

VERTICAL SEMICONDUCTOR DEVICES INCLUDING SUPERLATTICE PUNCH THROUGH STOP LAYER AND RELATED METHODS

FIELD OF THE INVENTION

The present invention relates to the field of semiconductors, and, more particularly, to semiconductor devices comprising superlattices and associated methods.

BACKGROUND OF THE INVENTION

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an n-channel MOSFET is asserted to have a higher mobility.

U.S. Pat. No. 4,937,204 to Ishibashi et al. discloses a superlattice in which a plurality of layers, less than eight monolayers, and containing a fractional or binary or a binary compound semiconductor layer, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of $SiO_2$/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen. The Si/O superlattice is disclosed as useful in a silicon quantum and light-emitting devices. In particular, a green electromuminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

Published International Application WO 02/103,767 A1 to Wang, Tsu and Lofgren, discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc, can be tailored to yield new aperiodic materials with desirable band-structure characteristics. Other parameters, such as electrical conductivity, thermal conductivity and dielectric permittivity or magnetic permeability are disclosed as also possible to be designed into the material.

Despite the advantages provided by such structures, further developments may be desirable for integrating advanced semiconductor materials in various semiconductor devices.

SUMMARY

A method for making a semiconductor device may include forming a plurality of fins on a substrate. The fins may be formed by forming a plurality of spaced apart lower semiconductor fin portions extending vertically upward from the substrate, and forming at least one respective superlattice punch-through stop layer on each of the lower fin portions. Each superlattice punch-through stop layer may include a plurality of stacked groups of layers, with each group of layers of the superlattice punch-through stop layer comprising a plurality of stacked base semiconductor monolayers defining a base semiconductor portion and at least one non-semiconductor monolayer constrained within a crystal lattice of adjacent base semiconductor portions. A respective upper semiconductor fin portion may be formed above each of the at least one superlattice punch-through stop layers and extending vertically upward therefrom. The method may also include forming source and drain regions at opposing ends of the fins, and forming a gate overlying the fins.

More particularly, forming the at least one respective superlattice punch-through stop layer may include forming a respective plurality of vertically stacked superlattice punch-through stop layers on each of the lower fin portions with a respective semiconductor layer between each of the superlattice punch-through stop layers. The method may also include forming an insulating layer on the substrate surrounding the lower semiconductor fin portions.

By way of example, forming the plurality of fins may further include forming a superlattice layer on the substrate, epitaxially growing a bulk semiconductor layer on the superlattice layer, and etching a plurality of spaced apart trenches extending through the bulk semiconductor layer, the superlattice layer, and into the substrate to define the respective lower semiconductor fin portions, superlattice punch-through stop layers, and upper semiconductor fin portions. The method may further include performing a thermal anneal after forming the plurality of fins.

Each base semiconductor portion may comprise silicon, germanium, etc. The at least one non-semiconductor monolayer may comprise a non-semiconductor selected from the group consisting of oxygen, nitrogen, fluorine, and carbon-oxygen, for example. Furthermore, the gate may include an oxide layer overlying the superlattice channel and a gate electrode overlying the oxide layer. Moreover, at least some semiconductor atoms from opposing base semiconductor portions may be chemically bound together through the non-semiconductor layer therebetween.

A related semiconductor device may include a substrate, and a plurality of fins spaced apart on the substrate. Each of the fins may include a lower semiconductor fin portion extending vertically upward from the substrate, and at least one superlattice punch-through stop layer on the lower fin portion. The superlattice punch-through stop layer may include a plurality of stacked groups of layers, with each group of layers of the superlattice punch-through stop layer comprising a plurality of stacked base semiconductor monolayers defining a base semiconductor portion and at least one non-semiconductor monolayer constrained within a crystal lattice of adjacent base semiconductor portions. Each fin may also include an upper semiconductor fin portion above the at least one superlattice punch-through stop layer and extending vertically upward therefrom. The semiconductor device may also include source and drain regions at opposing ends of the fins, and a gate overlying the fins.

BRIEF DESCRIPTION OF THE DRAWINGS

FIG. 9a is a flow diagram illustrating a method for making a semiconductor device similar to that of FIG. 5.

FIGS. 9b(i)-9b(iv) are a series of cross-sectional diagrams corresponding to the method steps illustrated in FIG. 9a.

DETAILED DESCRIPTION

Figure 1:
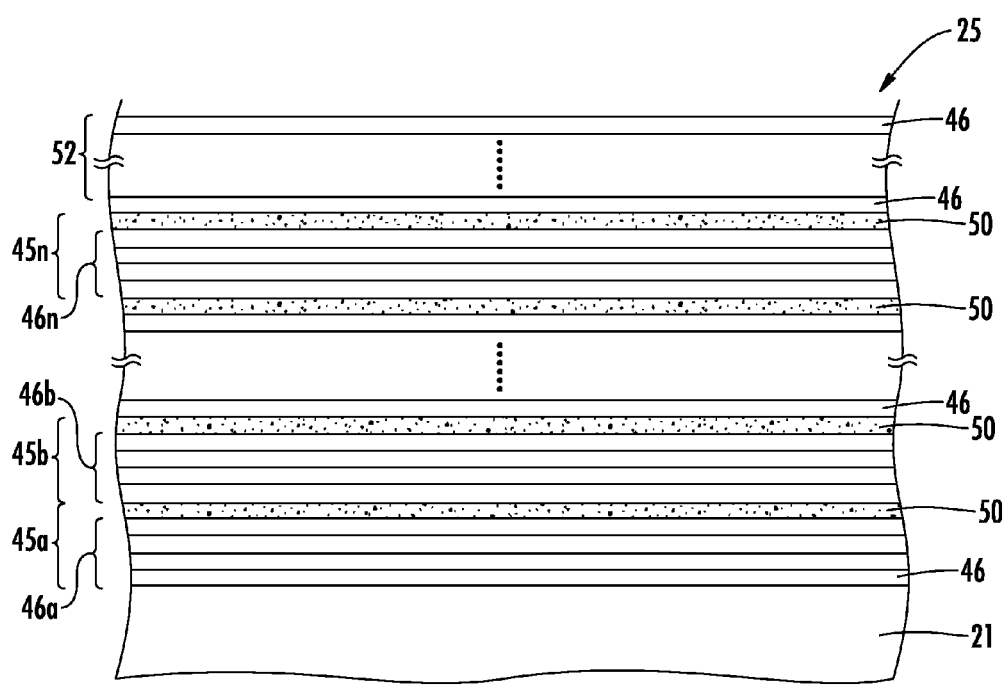
FIG. 1 is a greatly enlarged schematic cross-sectional view of a superlattice for use in a semiconductor device in accordance with the present invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in different embodiments.

The present invention relates to controlling the properties of semiconductor materials at the atomic or molecular level. Further, the invention relates to the identification, creation, and use of improved materials for use in semiconductor devices.

Applicants theorize, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicants use a "conductivity reciprocal effective mass tensor", $M_e^{-1}$ and $M_h^{-1}$ for electrons and holes respectively, defined as:

$$M_{e,ij}^{-1}(E_F, T) = \frac{\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{B.Z.} f(E(k,n), E_F, T) d^3k}$$

for electrons and:

$$M_{h,ij}^{-1}(E_F, T) = \frac{-\sum_{E<E_F} \int_{B.Z.} (\nabla_k E(k,n))_i (\nabla_k E(k,n))_j \frac{\partial f(E(k,n), E_F, T)}{\partial E} d^3k}{\sum_{E<E_F} \int_{B.Z.} (1 - f(E(k,n), E_F, T)) d^3k}$$

for holes, where f is the Fermi-Dirac distribution, $E_F$ is the Fermi energy, T is the temperature, E(k,n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicants' definition of the conductivity reciprocal effective mass tensor is such that a tensorial component of the conductivity of the material is greater for greater values of the corresponding component of the conductivity reciprocal effective mass tensor. Again Applicants theorize without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Applicants have identified improved materials or structures for use in semiconductor devices. More specifically, the Applicants have identified materials or structures having energy band structures for which the appropriate conductivity effective masses for electrons and/or holes are substantially less than the corresponding values for silicon. In addition to the enhanced mobility characteristics of these structures, they may also be formed or used in such a manner that they provide piezoelectric, pyroelectric, and/or ferroelectric properties that are advantageous for use in a variety of different types of devices, as will be discussed further below.

Figure 2:
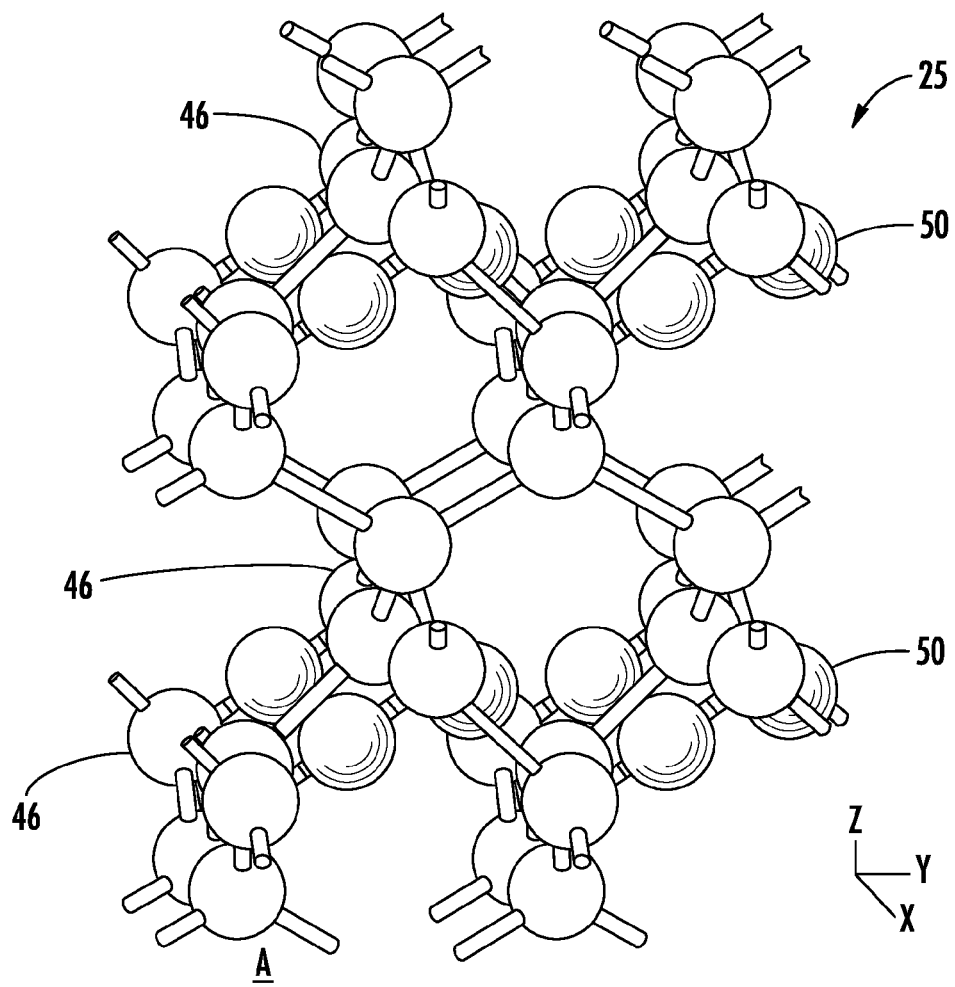
FIG. 2 is a perspective schematic atomic diagram of a portion of the superlattice shown in FIG. 1.

Referring now to FIGS. 1 and 2, the materials or structures are in the form of a superlattice 25 whose structure is controlled at the atomic or molecular level and may be formed using known techniques of atomic or molecular layer deposition. The superlattice 25 includes a plurality of layer groups 45a-45n arranged in stacked relation, as perhaps best understood with specific reference to the schematic cross-sectional view of FIG. 1.

Each group of layers 45a-45n of the superlattice 25 illustratively includes a plurality of stacked base semiconductor monolayers 46 defining a respective base semiconductor portion 46a-46n and an energy band-modifying layer 50 thereon. The energy band-modifying layers 50 are indicated by stippling in FIG. 1 for clarity of illustration.

The energy band-modifying layer 50 illustratively includes one non-semiconductor monolayer constrained within a crystal lattice of adjacent base semiconductor portions. By "constrained within a crystal lattice of adjacent base semiconductor portions" it is meant that at least some semiconductor atoms from opposing base semiconductor portions 46a-46n are chemically bound together through the non-semiconductor monolayer 50 therebetween, as seen in FIG. 2. Generally speaking, this configuration is made possible by controlling the amount of non-semiconductor material that is deposited on semiconductor portions 46a-46n through atomic layer deposition techniques so that not all (i.e., less than full or 100% coverage) of the available semiconductor bonding sites are populated with bonds to non-semiconductor atoms, as will be discussed further below. Thus, as further monolayers 46 of semiconductor material are deposited on or over a non-semiconductor monolayer 50, the newly deposited semiconductor atoms will populate the remaining vacant bonding sites of the semiconductor atoms below the non-semiconductor monolayer.

In other embodiments, more than one such non-semiconductor monolayer may be possible. It should be noted that reference herein to a non-semiconductor or semiconductor monolayer means that the material used for the monolayer would be a non-semiconductor or semiconductor if formed in bulk. That is, a single monolayer of a material, such as silicon, may not necessarily exhibit the same properties that it would if formed in bulk or in a relatively thick layer, as will be appreciated by those skilled in the art.

Applicants theorize without wishing to be bound thereto that energy band-modifying layers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure, while also advantageously functioning as an insulator between layers or regions vertically above and below the superlattice.

Moreover, this superlattice structure may also advantageously act as a barrier to dopant and/or material diffusion between layers vertically above and below the superlattice 25. These properties may thus advantageously allow the superlattice 25 to provide an interface for high-K dielectrics which not only reduces diffusion of the high-K material into the channel region, but which may also advantageously reduce unwanted scattering effects and improve device mobility, as will be appreciated by those skilled in the art.

It is also theorized that semiconductor devices including the superlattice 25 may enjoy a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for opto-electronic devices, for example.

The superlattice 25 also illustratively includes a cap layer 52 on an upper layer group 45n. The cap layer 52 may comprise a plurality of base semiconductor monolayers 46. The cap layer 52 may have between 2 to 100 monolayers of the base semiconductor, and, more preferably between 10 to 50 monolayers.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, carbon and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example It should be noted that the term monolayer is meant to include a single atomic layer and also a single molecular layer. It is also noted that the energy band-modifying layer 50 provided by a single monolayer is also meant to include a monolayer wherein not all of the possible sites are occupied (i.e., there is less than full or 100% coverage). For example, with particular reference to the atomic diagram of FIG. 2, a 4/1 repeating structure is illustrated for silicon as the base semiconductor material, and oxygen as the energy band-modifying material. Only half of the possible sites for oxygen are occupied in the illustrated example.

In other embodiments and/or with different materials this one-half occupation would not necessarily be the case as will be appreciated by those skilled in the art. Indeed it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without Applicants wishing to be bound thereto that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 1 and 2, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons or holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein, as will also be appreciated by those skilled in the art.

Figure 3:
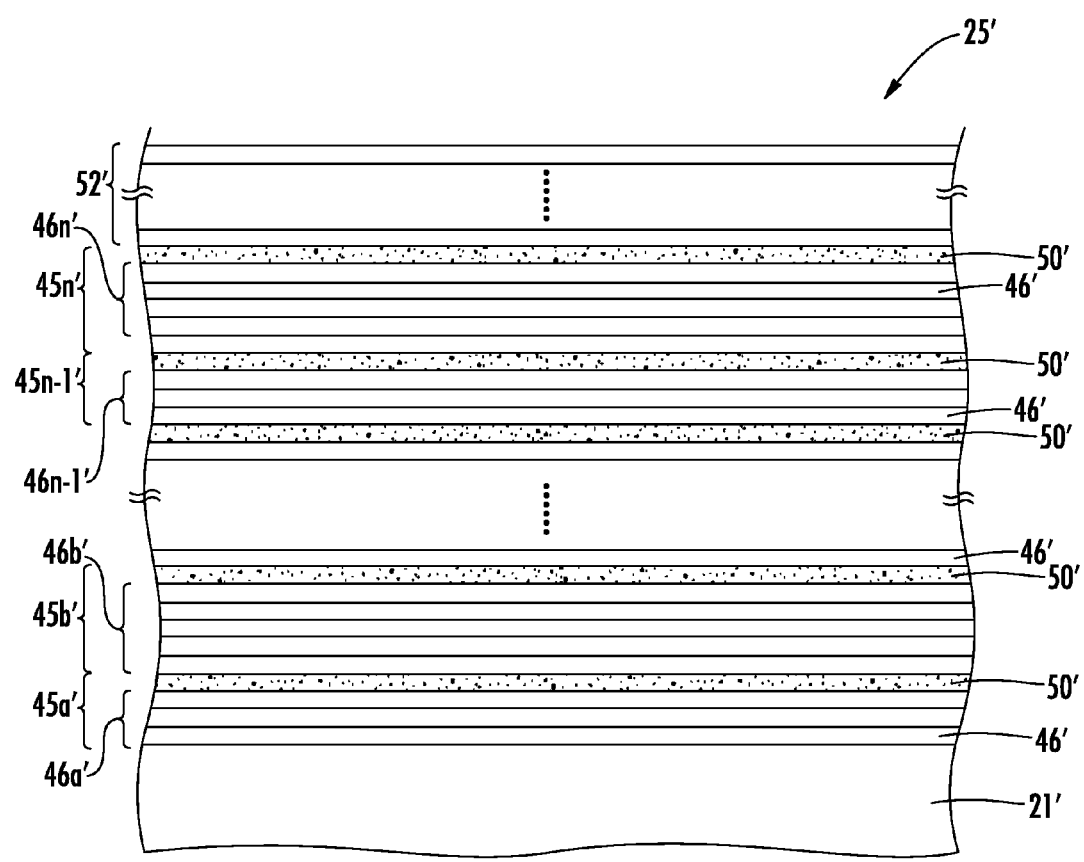
FIG. 3 is a greatly enlarged schematic cross-sectional view of another embodiment of a superlattice in accordance with the invention.

Indeed, referring now additionally to FIG. 3, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 3 not specifically mentioned are similar to those discussed above with reference to FIG. 1 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 4A:
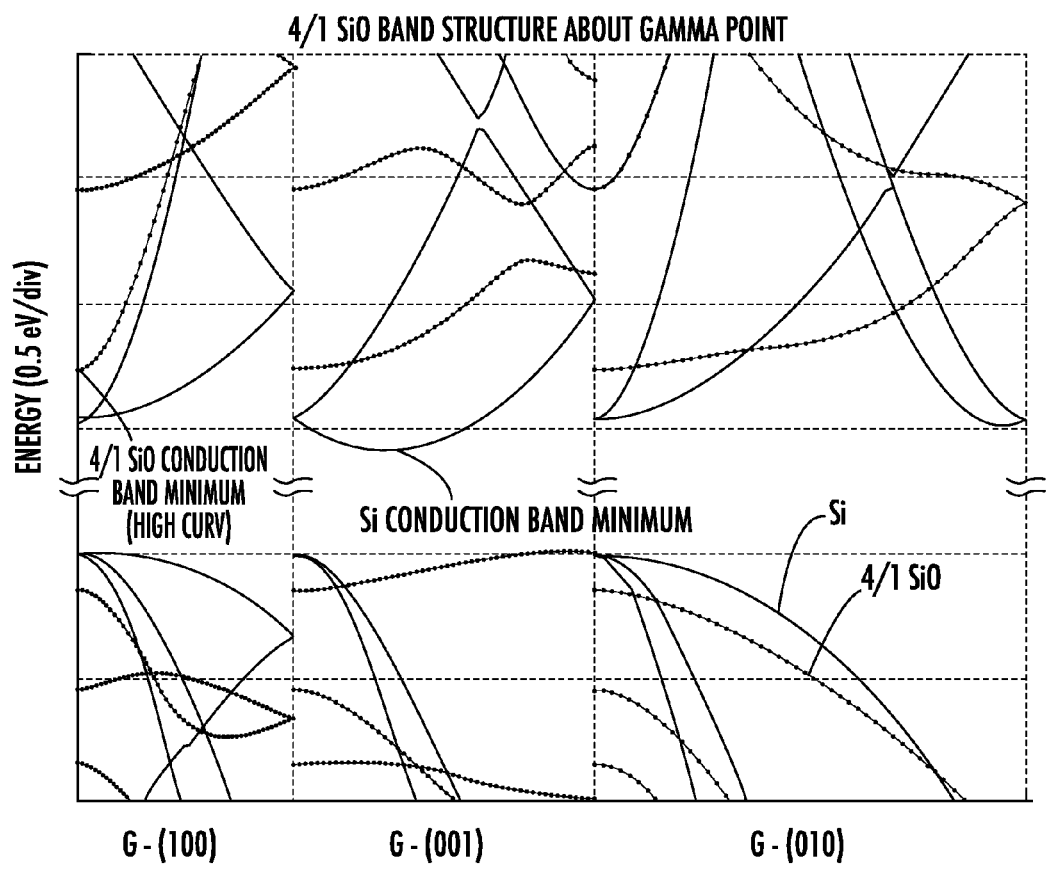
FIG. 4A is a graph of the calculated band structure from the gamma point (G) for both bulk silicon as in the prior art, and for the 4/1 Si/O superlattice as shown in FIGS. 1-2.
Figure 4B:
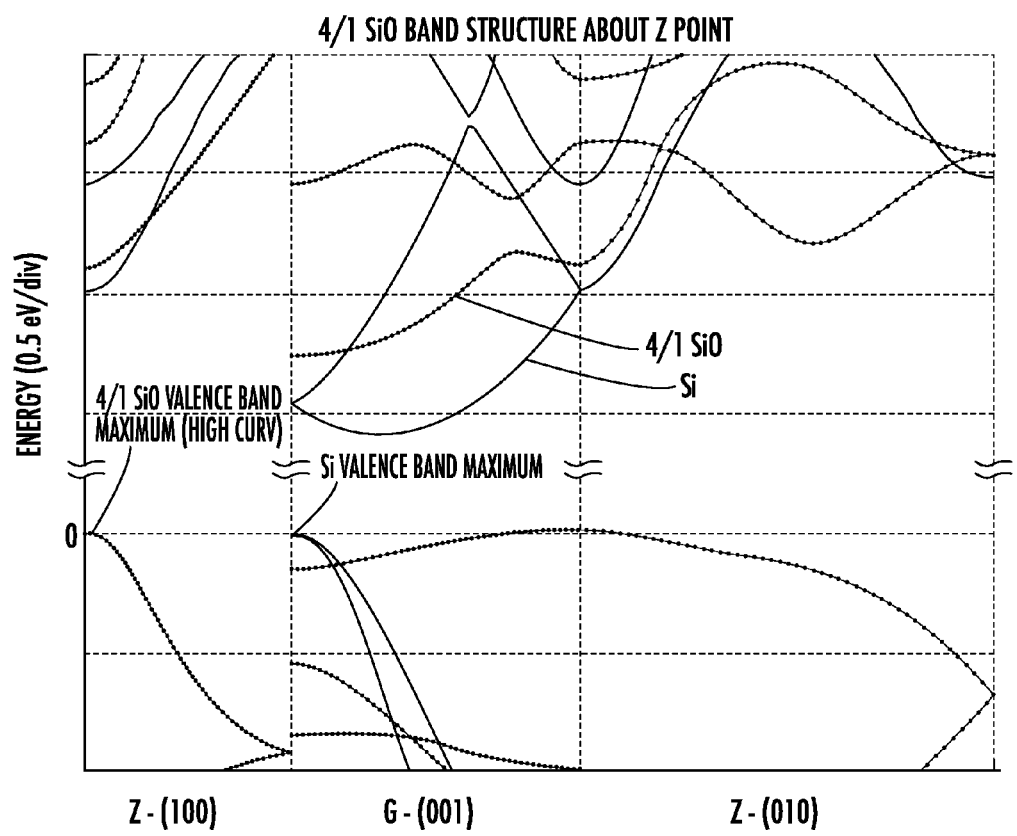
FIG. 4B is a graph of the calculated band structure from the Z point for both bulk silicon as in the prior art, and for the 4/1 Si/O superlattice as shown in FIGS. 1-2.
Figure 4C:
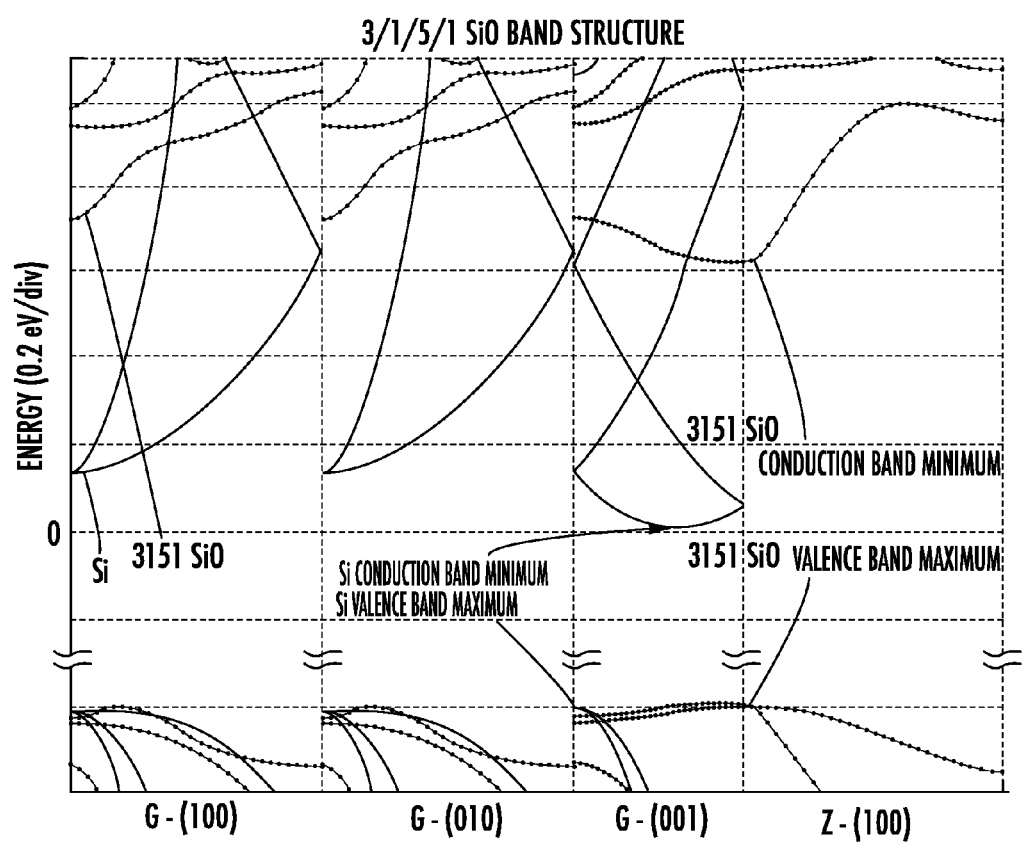
FIG. 4C is a graph of the calculated band structure from both the gamma and Z points for both bulk silicon as in the prior art, and for the 5/1/3/1 Si/O superlattice as shown in FIG. 3.

In FIGS. 4A-4C, band structures calculated using Density Functional Theory (DFT) are presented. It is well known in the art that DFT underestimates the absolute value of the bandgap. Hence all bands above the gap may be shifted by an appropriate "scissors correction." However the shape of the band is known to be much more reliable. The vertical energy axes should be interpreted in this light.

FIG. 4A shows the calculated band structure from the gamma point (G) for both bulk silicon (represented by continuous lines) and for the 4/1 Si/O superlattice 25 shown in FIG. 1 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (-110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 4B shows the calculated band structure from the Z point for both bulk silicon (continuous lines) and for the 4/1 Si/O superlattice 25 (dotted lines). This figure illustrates the enhanced curvature of the valence band in the (100) direction.

FIG. 4C shows the calculated band structure from both the gamma and Z point for both bulk silicon (continuous lines) and for the 5/1/3/1 Si/O structure of the superlattice 25' of FIG. 3 (dotted lines). Due to the symmetry of the 5/1/3/1 Si/O structure, the calculated band structures in the (100) and (010) directions are equivalent. Thus the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicants to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Figure 5:
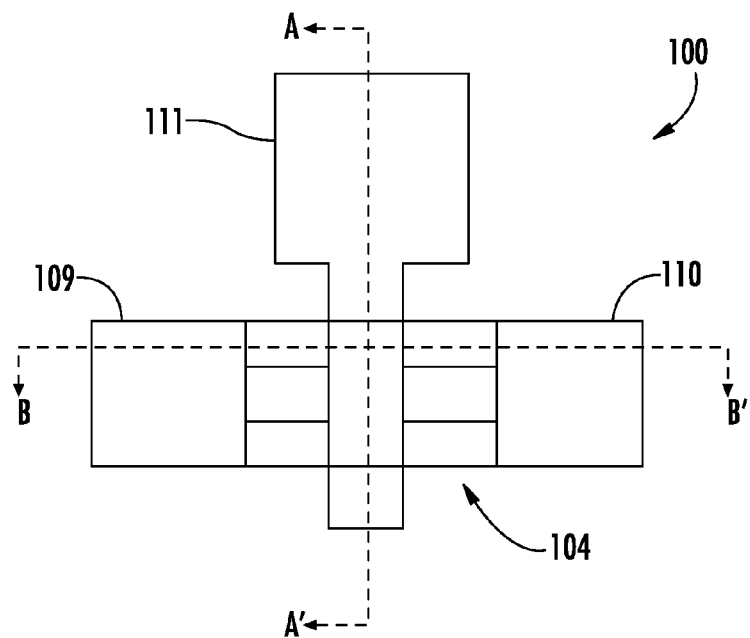
FIG. 5 is a top plan view of a semiconductor device in accordance with an example embodiment including superlattice punch through stop layers.
Figure 6:
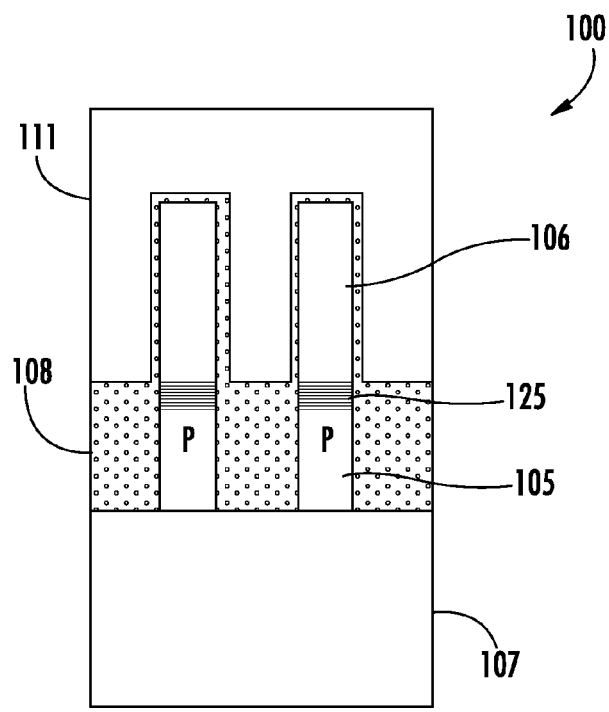
FIG. 6 is a cross-sectional view of the semiconductor device of FIG. 5 taken along the line A-A'.

Using the above-described measures, one can select materials having improved band structures for specific purposes. Referring more particularly to FIGS. 5 and 6, a first example would be a superlattice material layer 125 in a vertical semiconductor device 100, such as a FINFET, in which the superlattice material layer is used for dopant blocking within each semiconductor fin 104. More particularly, it may generally be desirable to dope a bottom portion 105 of a fin 104 to help reduce leakage (a P-type dopant is used in the illustrated NMOS embodiment, but an N-type dopant may be used for a PMOS device, as will be discussed further below). However, it may also be desirable to have an upper channel portion 106 of the fin 104 remain undoped, but it may be difficult to prevent dopant creep from the bottom of the fin 105 into the upper channel portion of the fin. The superlattice layer 125 may advantageously provide a self-aligned punch-through stop layer for preventing dopant from the lower portion 105 of the fin 104 from creeping into the upper undoped portion 106 of the fin, in addition to the leakage reduction properties of the superlattice itself, as described above. The upper (undoped) portion 106 of each fin 104 may advantageously be epitaxially grown on top of a respective superlattice layer 125, as also described above.

The fins 104 are formed on a substrate 107 (e.g., silicon substrate), and a source and drain regions 109, 110 are formed at opposing ends of the fins 104 (see FIG. 5). An insulating layer 108 (e.g., SiO$_2$) is formed over the fins 104 and source and drain regions 109, 110. Moreover, a gate 111 is formed overlying the fins 104 and the insulating layer 108.

Figure 7:
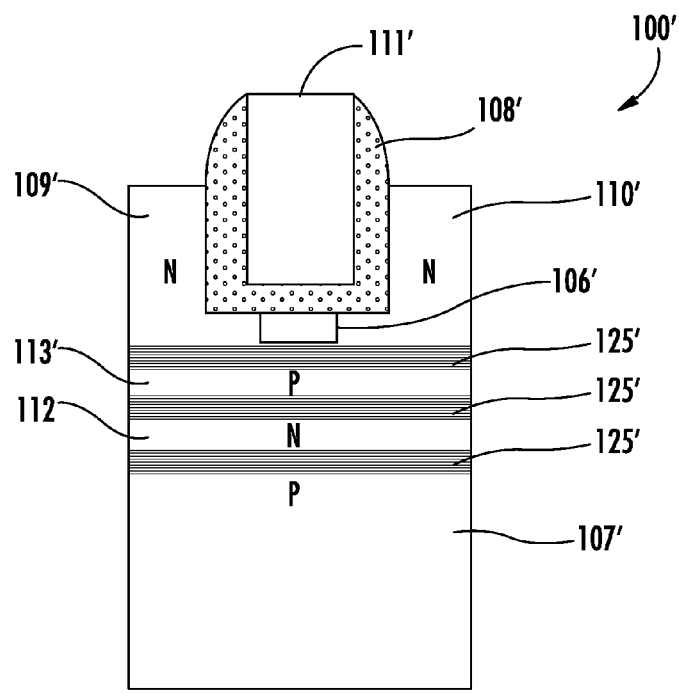
FIG. 7 is a cross-sectional view of another example semiconductor device similar to that of FIG. 5 and taken along the line B-B'.

A second related example embodiment is shown in FIG. 7, in which a vertical device 100' includes a "quasi-BOX" structure below the upper channel portion 106', in which a series of vertically spaced-apart superlattice layers 125' have regions or layers 112', 113' of a bulk semiconductor (e.g., Si) stacked therebetween and with alternating dopant types. In the illustrated example, the stack includes a bottom superlattice layer 125' on the Si substrate 107', an N-type Si layer 112' on the bottom superlattice layer, an intermediate superlattice layer on the N-type Si layer, a P-type Si layer 113' on the intermediate superlattice layer, and an upper superlattice layer on the P-type Si layer. The Si channel 106' may advantageously be grown on top of the upper superlattice layer 125', as noted above. However, in some embodiments the channel may reside partially or completely in the upper superlattice layer 125', if desired. This quasi-BOX structure may conceptually be considered to perform a similar function to a buried oxide (BOX) layer, but here the quasi-BOX stack provides an added benefit of an embedded P-N junction to provide further isolation of the channel region, as will be appreciated by those skilled in the art.

Figure 8:
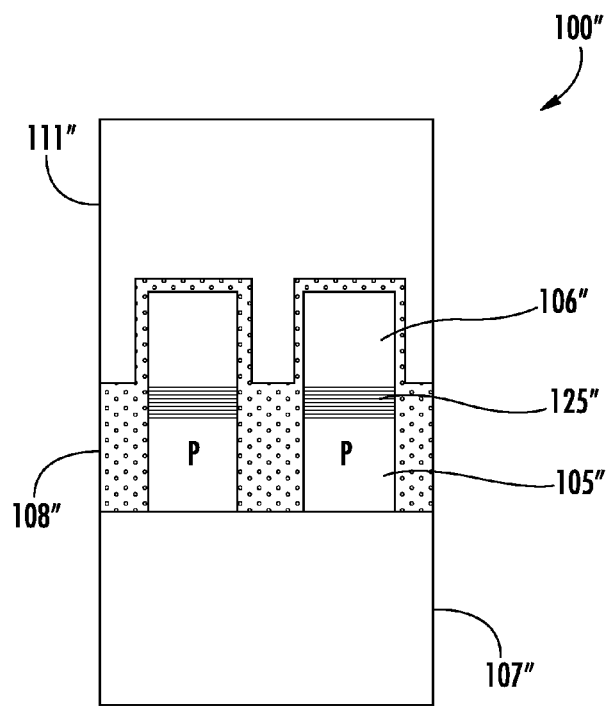
FIG. 8 is a cross-sectional view of yet another semiconductor device similar to that of FIG. 5 and taken along the line A-A'.

In accordance with a third example as described with reference to FIG. 8, a "quasi-planar" semiconductor device 100" is similar to the FINFET embodiment described above with respect to FIG. 6, but with a shorter and wider profile for the fins. This embodiment may be advantageous in certain implementations, as it may help relax fin patterning requirements, for example.

An example method for making a CMOS version of the semiconductor device 100 will now be described with reference to FIGS. 9a and 9b. Beginning at Block 201, a blanket superlattice layer 125 may be formed on a silicon substrate 107, followed by an epitaxial silicon growth above the superlattice layer (FIG. 9b, (i)). Deep punch-through stop implants (e.g., N-type for PMOS, P-type for NMOS) may then be performed at Block 202 (FIG. 9b, (ii)), followed by a fin 104 patterning/isolation processing module, at Block 203 (FIG. 9b, (iii)). Gate 111 and source/drain 109, 110 processing may then be performed using typical steps for FINFET processing, for example, at Blocks 204-205 (FIG. 9b, (iv)).

Many modifications and other embodiments will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A semiconductor device comprising:
a substrate;
a plurality of fins spaced apart on said substrate, each of said fins comprising
a lower semiconductor fin portion extending vertically upward from the substrate,
a plurality of spaced apart superlattice punch-through stop layers on the lower fin portion, each superlattice punch-through stop layer including a plurality of stacked groups of layers, each group of layers of the superlattice punch-through stop layer comprising a plurality of stacked base semiconductor monolayers defining a base semiconductor portion and at least one non-semiconductor monolayer constrained within a crystal lattice of adjacent base semiconductor portions,
a respective bulk semiconductor layer between adjacent superlattice punch-through stop layers, and
an upper semiconductor fin portion on an uppermost one of said superlattice punch-through stop layers and extending vertically upward therefrom;
source and drain regions at opposing ends of the fins; and
a gate overlying the fins.

2. The semiconductor device of claim 1 further comprising an insulating layer on the substrate surrounding the lower semiconductor fin portions.

3. The semiconductor device of claim 1 wherein each base semiconductor portion comprises silicon.

4. The semiconductor device of claim 1 wherein each base semiconductor portion comprises germanium.

5. The semiconductor device of claim 1 wherein the at least one non-semiconductor layer comprises oxygen.

6. The semiconductor device of claim 1 wherein the at least one non-semiconductor monolayer comprises a non-semiconductor selected from the group consisting of oxygen, nitrogen, fluorine, and carbon-oxygen.

7. The semiconductor device of claim 1 wherein the gate comprises an oxide layer overlying the superlattice channel and a gate electrode overlying the oxide layer.

8. The semiconductor device of claim 1 wherein at least some semiconductor atoms from opposing base semiconductor portions are chemically bound together through the non-semiconductor layer therebetween.

9. A semiconductor device comprising:
a substrate;
a plurality of fins spaced apart on said substrate, each of said fins comprising
a lower semiconductor fin portion extending vertically upward from the substrate,
a plurality of spaced apart superlattice punch-through stop layers on the lower fin portion, each superlattice punch-through stop layer including a plurality of stacked groups of layers, each group of layers of the superlattice punch-through stop layer comprising a plurality of stacked base silicon monolayers defining a base silicon portion and at least one oxygen monolayer constrained within a crystal lattice of adjacent base silicon portions,
a respective bulk semiconductor layer between adjacent superlattice punch-through stop layers, and
an upper semiconductor fin portion on an uppermost one of said superlattice punch-through stop layers and extending vertically upward therefrom;
source and drain regions at opposing ends of the fins; and
a gate overlying the fins.

10. The semiconductor device of claim 9 further comprising an insulating layer on the substrate surrounding the lower semiconductor fin portions.

11. A semiconductor device comprising:
a substrate;
a plurality of fins spaced apart on said substrate, each of said fins comprising
a lower semiconductor fin portion extending vertically upward from the substrate,
a plurality of spaced apart superlattice punch-through stop layers on the lower fin portion, each superlattice punch-through stop layer including a plurality of stacked groups of layers, each group of layers of the superlattice punch-through stop layer comprising a plurality of stacked base germanium monolayers defining a base germanium portion and at least one non-semiconductor monolayer constrained within a crystal lattice of adjacent base germanium portions, with the at least one non-semiconductor monolayer comprising a non-semiconductor selected from the group consisting of oxygen, nitrogen, fluorine, and carbon-oxygen, a respective bulk semiconductor layer between adjacent superlattice punch-through stop layers, and an upper semiconductor fin portion on an uppermost one of said superlattice punch-through stop layers and extending vertically upward therefrom;

source and drain regions at opposing ends of the fins; and a gate overlying the fins.

12. The semiconductor device of claim 11 further comprising an insulating layer on the substrate surrounding the lower semiconductor fin portions.

\* \* \* \* \*